(12) United States Patent
Kagaya et al.

(10) Patent No.: US 11,658,008 B2
(45) Date of Patent: May 23, 2023

(54) FILM FORMING APPARATUS AND FILM FORMING METHOD

(71) Applicant: Tokyo Electron Limited, Tokyo (JP)

(72) Inventors: Munehito Kagaya, Nirasaki (JP); Yusuke Suzuki, Nirasaki (JP); Shinya Iwashita, Nirasaki (JP); Tadashi Mitsunari, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/286,364

(22) PCT Filed: Oct. 17, 2019

(86) PCT No.: PCT/JP2019/040976
§ 371 (c)(1),
(2) Date: Apr. 16, 2021

(87) PCT Pub. No.: WO2020/085215
PCT Pub. Date: Apr. 30, 2020

(65) Prior Publication Data
US 2021/0375589 A1    Dec. 2, 2021

(30) Foreign Application Priority Data
Oct. 23, 2018   (JP) .............................. JP2018-199333

(51) Int. Cl.
*C23C 16/34* (2006.01)
*C23C 16/40* (2006.01)
(Continued)

(52) U.S. Cl.
CPC ...... *H01J 37/32174* (2013.01); *C23C 16/345* (2013.01); *C23C 16/405* (2013.01); *C23C 16/4586* (2013.01); *C23C 16/45538* (2013.01); *C23C 16/45544* (2013.01); *C23C 16/52* (2013.01); *H01J 37/32568* (2013.01); *H01J 37/32577* (2013.01); *H01J 37/32724* (2013.01);
(Continued)

(58) Field of Classification Search
CPC ................ C23C 16/345; C23C 16/405; C23C 16/45544; C23C 16/52; H01L 21/0217; H01L 21/02186; H01L 21/02274; H01L 21/0228
See application file for complete search history.

(56) References Cited

U.S. PATENT DOCUMENTS

| | | | |
|---|---|---|---|
| 9,287,113 B2* | 3/2016 | Kang ................ | H01L 21/02219 |
| 2006/0211246 A1* | 9/2006 | Ishizaka ............ | C23C 16/45544 |
| | | | 257/E21.171 |
| 2011/0014795 A1* | 1/2011 | Lee ..................... | H01L 21/3185 |
| | | | 257/E21.293 |

FOREIGN PATENT DOCUMENTS

| | | |
|---|---|---|
| JP | H11-312672 A | 11/1999 |
| JP | 2011-023718 A | 2/2011 |

(Continued)

*Primary Examiner* — Elizabeth A Burkhart
(74) *Attorney, Agent, or Firm* — Armstrong Teasdale LLP

(57) ABSTRACT

When a titanium-containing gas and an oxidizing gas, or a silicon-containing gas and a nitriding gas, are alternately supplied from a gas supplier and radio frequency power is supplied to each of a first electrode and a second electrode from a power supply, parallel to the supply of the oxidizing gas or the nitriding gas, so as to generate plasma and to perform a film formation, a magnitude of the radio frequency power to be supplied to each of the first electrode and the second electrode is controlled.

7 Claims, 11 Drawing Sheets

(51) Int. Cl.
  *C23C 16/455* (2006.01)
  *H01L 21/02* (2006.01)
  *H01J 37/32* (2006.01)
  *C23C 16/458* (2006.01)
  *C23C 16/52* (2006.01)

(52) U.S. Cl.
  CPC ...... *H01L 21/0217* (2013.01); *H01L 21/0228* (2013.01); *H01L 21/02186* (2013.01); *H01L 21/02274* (2013.01); *H01J 2237/3321* (2013.01)

(56) References Cited

FOREIGN PATENT DOCUMENTS

| | | | |
|---|---|---|---|
| JP | 2014-093436 A | | 5/2014 |
| JP | 2015-026475 A | | 2/2015 |
| JP | 2015-026475 A | | 5/2015 |
| JP | 2018-064031 A | | 4/2018 |
| WO | WO 2014/149259 | * | 9/2014 |

* cited by examiner

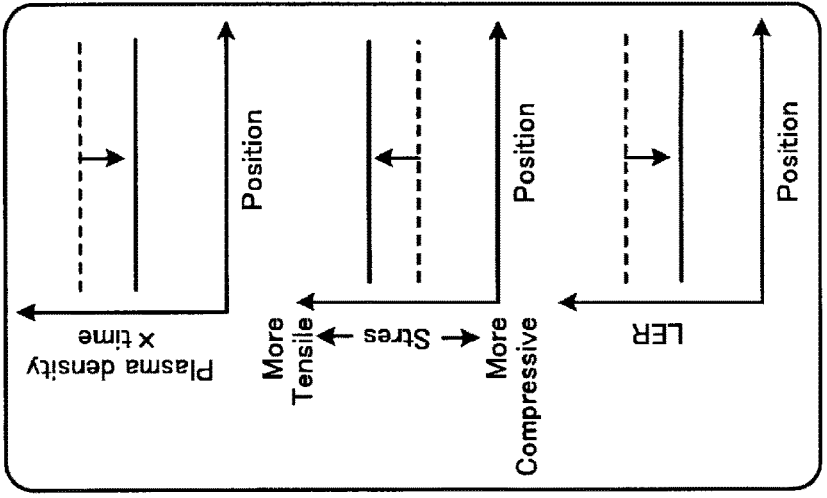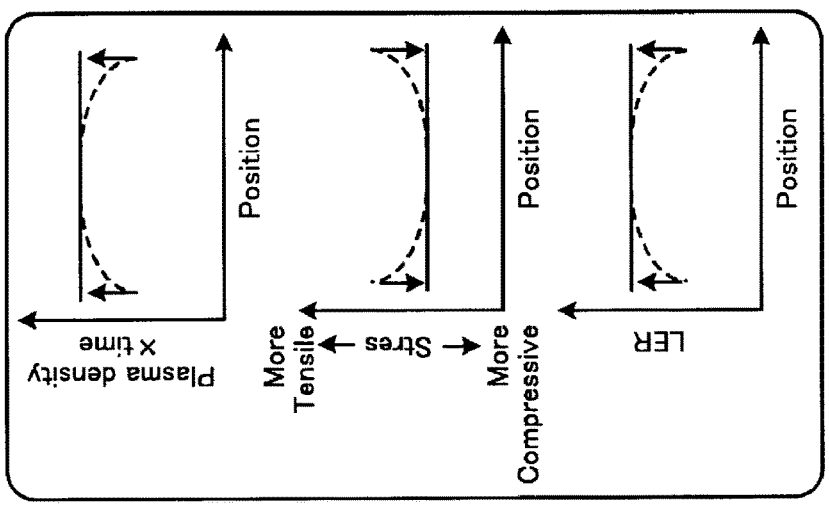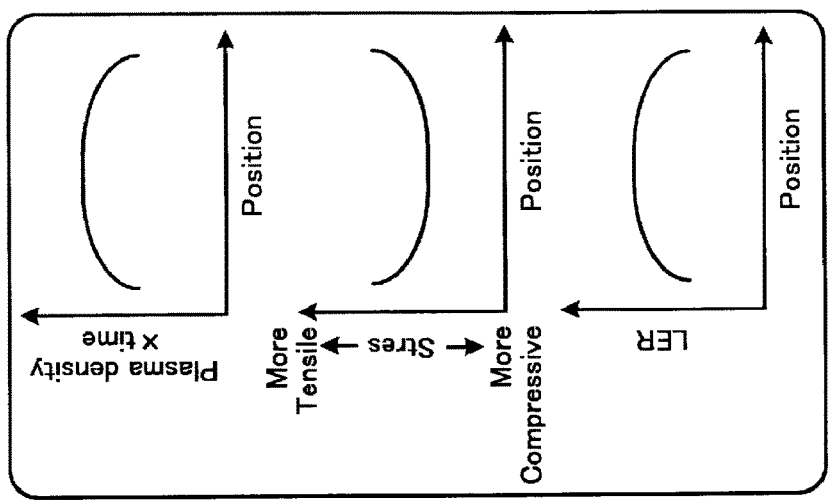

FILM FORMING APPARATUS AND FILM FORMING METHOD

CROSS-REFERENCE TO RELATED APPLICATIONS

This application is a National Stage Application of International Patent Application No. PCT/JP2019/040976, having an International Filing Date of Oct. 17, 2019, which claims the benefit of priority to Japanese Patent Application No. 2018-199333, filed Oct. 23, 2018, the entire contents of each of which are hereby incorporated by reference herein.

TECHNICAL FIELD

The present disclosure relates to a film forming apparatus and a film forming method.

BACKGROUND

Patent Documents 1 and 2 disclose a capacitively coupled plasma processing apparatus that distributedly supplies radio frequency power to an inner upper electrode and an outer upper electrode which are arranged to face a lower electrode on which a substrate is placed.

PRIOR ART DOCUMENT

Patent Document

Patent Document 1: Japanese Laid-Open Patent Publication No. 2015-26475
Patent Document 2: Japanese Laid-Open Patent Publication No. 2014-93436

SUMMARY

The present disclosure provides a technique for controlling a film stress of a film to be formed.

A film forming apparatus according to an aspect of the present disclosure includes a processing container, a first electrode, a second electrode, a power supply, an adjuster, a gas supplier, and a controller. The processing container is provided with a stage on which a substrate as an object on which a film is to be formed is placed. The first electrode is disposed around the stage while facing the processing container. The second electrode is disposed around the first electrode while facing the stage. The power supply supplies radio frequency power to the first electrode and the second electrode. The adjuster adjusts a magnitude of the radio frequency power to be supplied from the power supply to each of the first electrode and the second electrode. The gas supplier supplies a titanium-containing gas and an oxidizing gas that oxidizes titanium, or a silicon-containing gas and a nitriding gas that nitrides silicon into a processing container. When the titanium-containing gas and the oxidizing gas, or the silicon-containing gas and the nitriding gas, are alternately supplied from the gas supplier and the radio frequency power is supplied to each of the first electrode and the second electrode from the power supply, parallel to the supply of the oxidizing gas or the nitriding gas, so as to generate plasma and to perform a film formation, the controller controls the magnitude of the radio frequency power to be supplied to each of the first electrode and the second electrode.

According to the present disclosure, it is possible to control a film stress of a film to be formed.

BRIEF DESCRIPTION OF DRAWINGS

FIGS. 10A to 10C are views illustrating an example of changes in film stress and LER due to the adjustment of the magnitude of the radio frequency power.

DETAILED DESCRIPTION

Hereinafter, embodiments of a film forming apparatus and a film forming method disclosed herein will be described in detail with reference to the drawings. The film forming apparatus and the film forming method disclosed herein are not limited to the embodiments.

In the manufacturing of electronic devices, an oxide film or a nitride film is formed on a substrate such as a semiconductor wafer. A film stress of the formed film may significantly influence the final device. For example, when the film stress of the formed film is non-uniform in the plane of the substrate, the performance of the electronic device changes in the plane of the substrate. Therefore, there is a need to control the film stress of a film to be formed.

[Configuration of Film Forming Apparatus]

Figure 1:
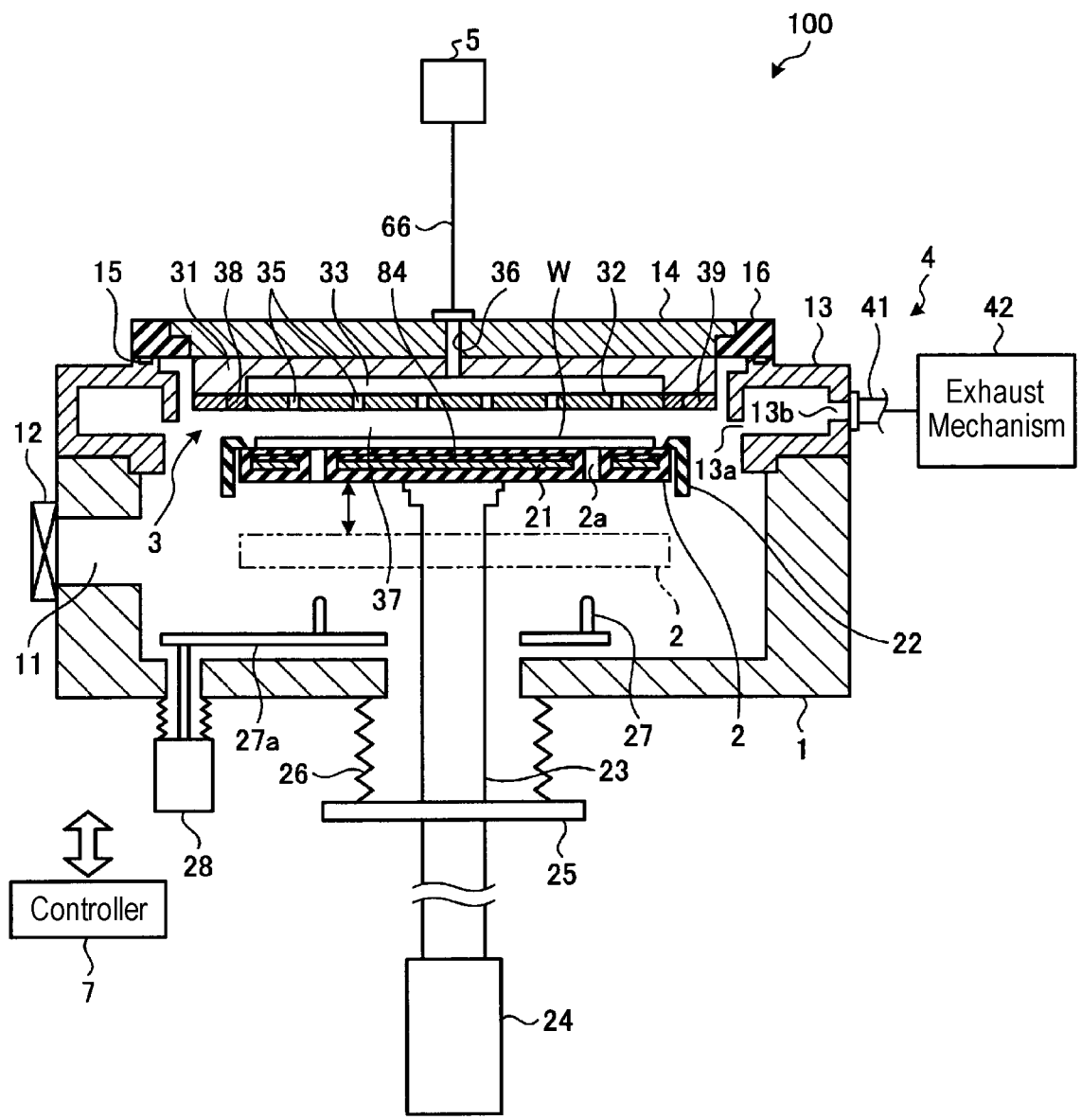
FIG. 1 is a view schematically illustrating a film forming apparatus according to an embodiment.

First, a configuration of a film forming apparatus 100 according to an embodiment will be described. FIG. 1 is a view schematically illustrating the film forming apparatus according to an embodiment. In FIG. 1, the structure of the film forming apparatus 100 according to an embodiment is schematically illustrated in a vertical cross section. The film forming apparatus 100 illustrated in FIG. 1 is a capacitively coupled parallel plate type plasma apparatus. The film forming apparatus 100 includes a processing container 1, a susceptor 2 configured to horizontally support a semiconductor wafer (hereinafter, simply referred to as a "wafer") W as a substrate to be processed inside the processing container 1, and a shower head 3 configured to supply a processing gas into the processing container 1 in the form of a shower. In addition, the film forming apparatus 100 includes an exhauster 4 configured to exhaust the interior of the processing container 1, a gas supplier 5 configured to supply the processing gas to the shower head 3, and a controller 7.

The processing container 1 is made of a metal such as aluminum, and has a substantially cylindrical shape. A loading/unloading port 11 through which the substrate W such as a semiconductor is loaded or unloaded is formed in a sidewall of the processing container 1. The loading/unloading port 11 is configured to be capable of being opened/closed by a gate valve 12. Annular exhaust duct 13 having a rectangular cross section is provided on a main body of the processing container 1. A slit 13a is formed in the exhaust duct 13 along an inner peripheral surface thereof. In addition, an exhaust port 13b is formed in an outer wall of the exhaust duct 13. On an upper surface of the exhaust duct 13, a ceiling wall 14 is provided so as to close an upper opening of the processing container 1. An insulating ring 16 is fitted into an outer periphery of the ceiling wall 14, and a space between the insulating ring 16 and the exhaust duct 13 is hermetically sealed by a seal ring 15.

The susceptor 2 is formed in a disk shape having a size corresponding to the substrate W. The substrate W is placed on the upper surface of the susceptor 2. The susceptor 2 has a bottom surface, the central portion of which is supported by a support member 23. The susceptor 2 is made of a ceramic material such as aluminum nitride (AlN), or a metallic material such as aluminum or a nickel-based alloy. A heater 21 is embedded in the susceptor 2 to heat the substrate W. The heater 21 generates heat by being supplied with power from a heater power supply (not illustrated). The controller 7 controls the output of the heater 21 based on a temperature signal provided from a thermocouple (not illustrated) provided in the vicinity of a substrate placement surface on the upper surface of the susceptor 2, thereby controlling a temperature of the substrate W to a predetermined temperature.

The susceptor 2 is provided with a cover member 22 made of ceramic such as alumina so as to cover an outer peripheral area of the wafer placement surface and a side surface of the susceptor 2.

In addition, the support member 23 has a columnar shape. A lower end of the support member 23 passes through a hole formed in a bottom wall of the processing container 1 to extend downward of the processing container 1, and is connected to a lifting mechanism 24. The lifting mechanism 24 raises and lowers the susceptor 2 and the support member 23. The susceptor 2 is configured to be raised and lowered by the lifting mechanism 24 between a processing position illustrated in FIG. 1 and a transfer position (indicated by a one-dot chain line below the processing position) at which the wafer can be transferred. In addition, the support member 23 is provided with a flange member 25 at a position below the processing container 1. A bellows 26, which is configured to isolate an internal atmosphere of the processing container 1 from ambient and to be flexible with the lifting movement of the susceptor 2, is provided between the bottom surface of the processing container 1 and the flange member 25.

Three wafer support pins 27 (of which only two are illustrated) are provided in the vicinity of the bottom surface of the processing container 1 so as to protrude upward from a lifting plate 27a. The wafer support pins 27 are movable up and down via the lifting plate 27a by the lifting mechanism 28 provided below the processing container 1, and are inserted into respective through-holes 2a formed in the susceptor 2 located at the transfer position so as to be movable un and down on the upper surface of the susceptor 2. By vertically moving the wafer support pins 27 in this manner, the substrate W is delivered between the wafer transfer mechanism (not illustrated) and the susceptor 2.

The shower head 3 is provided to face the susceptor 2, and has a diameter substantially equal to that of the susceptor 2. The shower head 3 has a main body 31 fixed to the ceiling wall 14 of the processing container 1 and a shower plate 32 connected to the lower side of the main body 31. A gas diffusion space 33 is formed between the main body 31 and the shower plate 32. A gas introduction hole 36, which is formed to penetrate through the centers of the main body 31 and the ceiling wall 14 of the processing container 1, is connected to the gas diffusion space 33. The shower plate 32 is disposed so as to face the susceptor 2. The shower plate 32 includes a large number of gas ejection holes 35 formed in a surface facing the susceptor 2. In the state in which the susceptor 2 is present at the processing position, a processing space 37 is formed between the shower plate 32 and the susceptor 2.

The shower plate 32 is made of a conductive material such as aluminum or stainless steel. In addition, the shower plate 32 has an insulating member 38 arranged therearound. A peripheral electrode 39 made of a conductive material is arranged around the insulating member 38. The peripheral electrode 39 faces the susceptor 2, and is arranged around the shower plate 32. The shower plate 32 has a diameter that is equal to or slightly larger than the diameter of the substrate W. As a result, a boundary between the shower plate 32 and the peripheral electrode 39 is located outside the substrate W. Byproducts such as deposits are likely to adhere to the boundary between the shower plate 32 and the peripheral electrode 39. However, even if the byproducts adhering to the boundary fall, it is possible to suppress the adhesion of the byproducts to the substrate W. Radio frequency power is supplied to the shower plate 32 and the peripheral electrode 39 during the generation of plasma. In the present embodiment, the shower plate 32 corresponds to a first electrode, and the peripheral electrode 39 corresponds to a second electrode.

Figure 2:
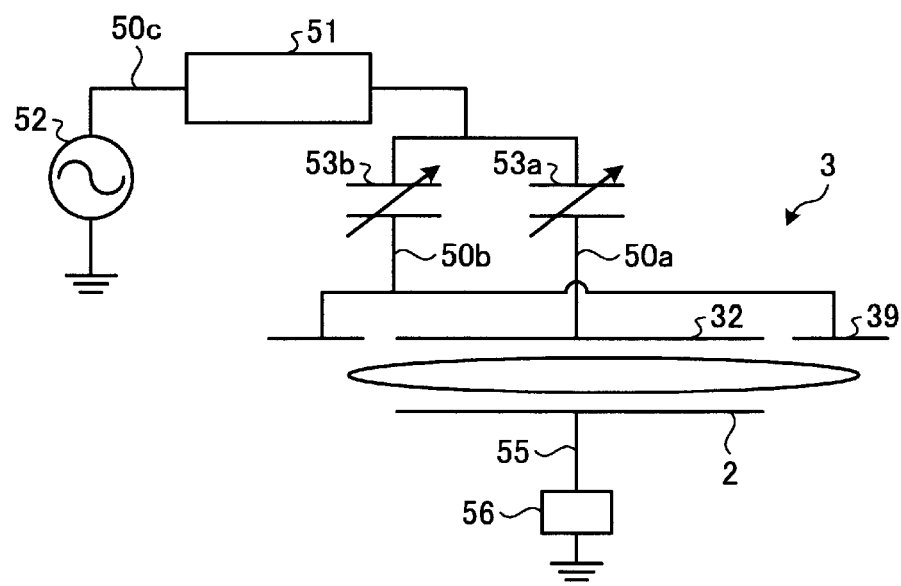
FIG. 2 is a view illustrating a shower head according to an embodiment in a simplified manner.

FIG. 2 is a view illustrating the shower head according to an embodiment in a simplified manner. The shower head 3 has the shower plate 32 and the peripheral electrode 39. The shower plate 32 and the peripheral electrode 39 are arranged so as to face the susceptor 2. A grounded wire 55 is connected to the susceptor 2. The wire 55 is provided with an impedance control mechanism 56 capable of adjusting impedance. A feeder line 50a is connected to the shower head 3. A feeder line 50b is connected to the peripheral electrode 39. The feeder lines 50a and 50b are connected to a matching circuit 51. A radio frequency power supply 52 is connected to the matching circuit 51 via a feeder line 50c.

The radio frequency power supply 52 supplies radio frequency power of a predetermined frequency to the shower plate 32 and the peripheral electrode 39 via the matching circuit 51. A frequency of the radio frequency power supplied from the radio frequency power supply 52 is preferably 200 kHz to 220 MHz. For example, a frequency of 450 kHz may be used. The supply path of the power from the radio frequency power supply 52 to the shower plate 32 and the peripheral electrode 39 is provided with an adjuster configured to adjust a magnitude of the radio frequency power to be supplied to the shower plate 32 and the peripheral electrode 39. For example, the feeder line 50a is provided with a variable capacitor 53a. The feeder line 50b is provided with a variable capacitor 53b. The variable capacitors 53a and 53b are configured to be capable of changing capacitances thereof, and thus adjust a ratio of the magnitude of the radio frequency power to be supplied from the radio frequency power supply 52 to the shower plate 32 and the magnitude of the radio frequency power to be supplied from the radio frequency power supply 52 to the peripheral electrode 39.

Returning back to FIG. 1, the exhauster 4 includes an exhaust pipe 41 connected to the exhaust port 13b of the exhaust duct 13, and an exhaust mechanism 42 connected to the exhaust pipe 41 and having, for example, a vacuum pump and a pressure control valve. During processing, the gas in the processing container 1 reaches the exhaust duct 13 through the slit 13a, and is exhausted from the exhaust duct 13 through the exhaust pipe 41 by the exhaust mechanism 42 of the exhauster 4.

A gas supplier 5 is connected to the gas introduction hole 36 of the shower head 3 via a gas pipe 66. The gas supplier 5 supplies various gases used for film formation to the gas diffusion space 33. For example, the gas supplier 5 includes a plurality of gas sources, a plurality of flow controllers such as mass flow controllers, and a plurality of valves. Each of the plurality of gas sources is connected to the gas diffusion space 33 via a corresponding one of the plurality of flow controllers and a corresponding one of the plurality of valves. The gas supplier 5 adjusts a flow rate of a gas from a gas source selected from the plurality of gas sources, and supplies the gas to the gas diffusion space 33 at the adjusted flow rate. The gas supplied to the gas diffusion space 33 is supplied to the processing space 37 from the plurality of gas ejection holes 35.

The operation of the film forming apparatus 100 configured as described above is controlled overall by the controller 7. The controller 7 is, for example, a computer, and includes, for example, a central processing unit (CPU), a random access memory (RAM), a read only memory (ROM), and an auxiliary storage device. The CPU operates on the basis of a program stored in the ROM or the auxiliary storage device, or a process condition of film formation, and controls the overall operation of the apparatus. For example, the controller 7 controls the starting and stopping of the supply of each gas, the flow rate of each gas, the loading and unloading of the substrate W, the temperature of the susceptor 2, the internal pressure of the processing container 1, the radio frequency power supplied from the radio frequency power supply 52, and the capacitances of the variable capacitors 53a and 53b. In addition, a computer-readable program necessary for control may be stored in a storage medium. The storage medium includes, for example, a flexible disk, a compact disc (CD), a CD-ROM, a hard disk, a flash memory, or a DVD. Further, the controller 7 may be provided inside or outside the film forming apparatus 100. In the case in which the controller 7 is provided outside the film forming apparatus 100, the controller 7 is capable of controlling the film forming apparatus 10 using a wired or wireless communication means.

Next, a flow of a film forming process executed by the film forming apparatus 100 under the control of the controller 7 will be briefly described.

The film forming apparatus 100 opens the gate valve 12. In the film forming apparatus 100, a transfer apparatus (not illustrated) loads the substrate W into the processing container 1 through the loading/unloading port 11 and places the substrate W on the susceptor 2. The film forming apparatus 100 raises the susceptor 2 to the processing position after the transfer apparatus is withdrawn. Then, the film forming apparatus 100 closes the gate valve 12 so as to maintain the interior of the processing container 1 in a predetermined depressurized state. The temperature of the susceptor 2 is controlled to a predetermined temperature (e.g., 200 degrees C.) by the heater 21 so that the substrate W is heated. The temperature of the substrate W may be 200 degrees C. or lower.

The film forming apparatus 100 forms an oxide film or a nitride film on the substrate W through plasma atomic layer deposition (ALD). In the present embodiment, a case in which the film forming apparatus 100 forms the oxide film on the substrate W will be described as an example. For example, the controller 7 controls the gas supplier 5 to alternately supply a titanium-containing gas and an oxide gas that oxidizes titanium. In addition, the controller 7 controls the radio frequency power supply 52 to supply radio frequency power to the shower plate 32 and the peripheral electrodes 39, parallel to the supply of the oxidizing gas, thus generating plasma and forming a titanium oxide ($TiO_2$) film. Examples of the titanium-containing gas may include $TiCl_4$, tetra (isopropoxy) titanium (TTIP), titanium tetrabromide ($TiBr_4$), titanium tetraiodide ($TiI_4$), tetrakisethylmethylaminotitanium (TEMAT), tetrakisdimethylaminotitanium (TDMAT), tetrakisdiethylaminotitanium (TDEAT), and the like. Examples of the oxidizing gas may include an oxygen-containing gas such as $O_2$ gas. The controller 7 performs a process of removing residual gas, for example, a purging process, between the supply of the titanium-containing gas and the supply of the oxidizing gas, and between the supply of the oxidizing gas and the supply of the titanium-containing gas.

Figure 3:
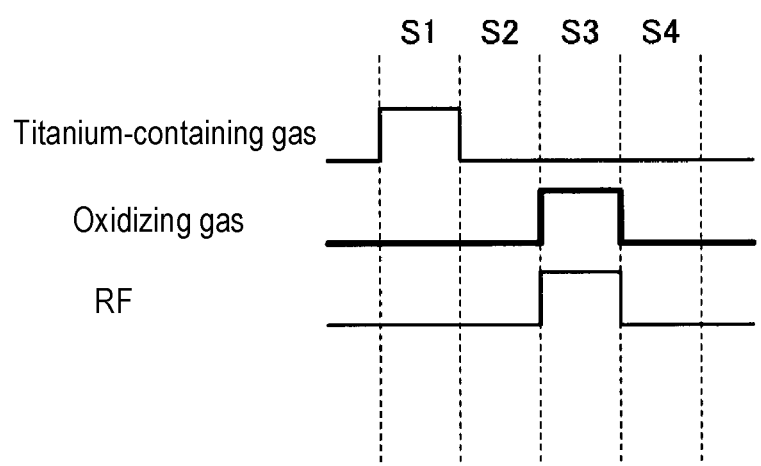
FIG. 3 is a view illustrating an exemplary flow of plasma ALD according to an embodiment.

Here, the flow of the plasma ALD carried out by the film forming apparatus 100 under the control of the controller 7 will be described. FIG. 3 is a view illustrating an example of the flow of the plasma ALD according to an embodiment. For example, in the plasma ALD illustrated in FIG. 3, steps S1 to S4 are sequentially performed.

In step S1, the titanium-containing gas (e.g., $TiCl_4$ gas) is supplied. As a result, a precursor is adsorbed on the substrate W due to the titanium-containing gas. In step S1, a gas for plasma generation (e.g., argon (Ar) gas) may be supplied together with a titanium-containing gas.

Subsequently, in step S2, the supply of the titanium-containing gas is stopped, a purge gas is supplied, and exhausting is performed. Thus, the titanium-containing gas is exhausted from the interior of the processing container 1.

Subsequently, in step S3, the supply of the purge gas is stopped, the oxidizing gas (e.g., $O_2$ gas) is supplied, and the radio frequency power (RF) is applied to the processing container 1 from the radio frequency power supply 52 so that plasma is generated inside the processing container 1. As a result, the precursor on the substrate W reacts with the oxidizing gas to form the titanium oxide on the substrate W.

Subsequently, in step S4, the supply of the oxidizing gas and the application of the radio frequency power are stopped, the purge gas is supplied, and exhausting is performed, thereby exhausting the oxidizing gas from the interior of the processing container 1.

The film forming apparatus 100 repeats steps S1 to S4 to form the titanium oxide film having a desired film thickness on the substrate W.

The flow of the plasma ALD is not limited to the above. As long as film formation is performed by supplying a titanium-containing gas so as to adsorb a precursor on the substrate W and then applying radio frequency power to the processing container 1 while supplying an oxidizing gas to generate plasma, the gas supply timing and the gas supply stop timing may be different from the above-described timings. For example, in the plasma ALD, the Ar gas and the $O_2$ gas may be continuously supplied in steps S1 to S4.

A film stress of a formed film may significantly influence a final device. For example, a titanium oxide film is widely used as an insulating film or a dielectric film, and there is a process of forming the titanium oxide film on silicon. For example, in double patterning, for example, a core material made of, for example, silicon, is formed with a predetermined pattern width using, for example, a photolithography method, and a titanium oxide film serving as a hard mask of the uppermost layer is formed on the core material. Subsequently, the titanium oxide film is etched so as to form a sidewall spacer made of the titanium oxide film on the sidewall of the core material. Subsequently, by etching and removing the core material, the sidewall spacer made of the titanium oxide film remains as a hard mask. Using the sidewall spacer as an etching mask, a film to be processed formed under the mask is anisotropically etched. This makes it possible to etch the film to be processed with a pattern width half that of the core material.

Figure 4:
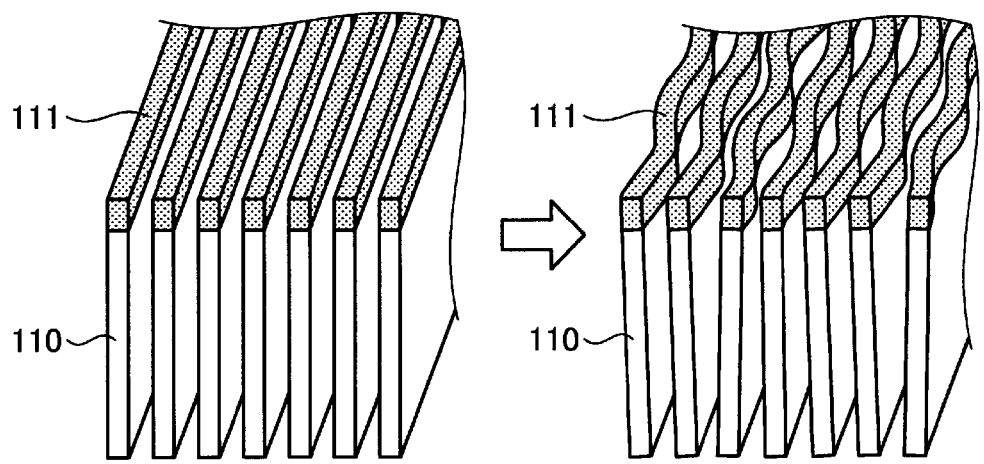
FIG. 4 is a view illustrating an example of the occurrence of buckling.

The titanium oxide film may buckle in the pattern after etching due to the film stress. When buckling occurs in the pattern of the titanium oxide film, line edge roughness (LER) may deteriorate or the pattern may collapse. FIG. 4 is a diagram showing an example of the occurrence of buckling. In FIG. 4, a titanium oxide film 111 is formed on an upper portion of a film to be processed 110. In the pattern of the titanium oxide film 111, buckling occurs due to compressive stress.

Figure 5:
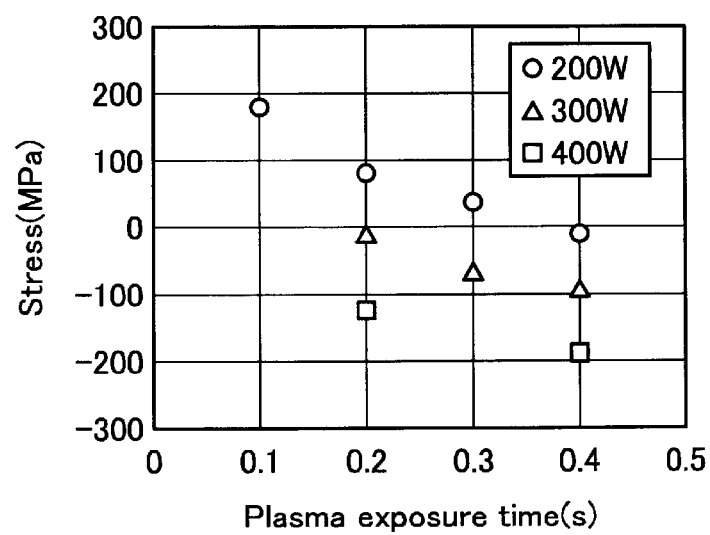
FIG. 5 is a view illustrating an example of a change in film stress due to radio frequency power and plasma irradiation time.

In the film formation of the titanium oxide film using the plasma ALD, the film stress shifts to the side of the compressive stress as the plasma irradiation time becomes longer and the magnitude of the radio frequency power increases. FIG. 5 is a view illustrating an example of a change in film stress in terms of the radio frequency power and the plasma irradiation time. In FIG. 5, there is shown a change in film stress in terms of the plasma irradiation time when the magnitude of the radio frequency power is set to 200 W, 300 W, and 400 W. The negative side of the film stress is represented as the compressive side, and the positive side thereof is represented as the tensile stress side. As illustrated in FIG. 5, when the plasma irradiation time is the same, the film stress shifts to the side of the compressive stress as the magnitude of the radio frequency power increases. In addition, the film stress shifts to the side of the compressive stress as the plasma irradiation time becomes longer.

Figure 6C:
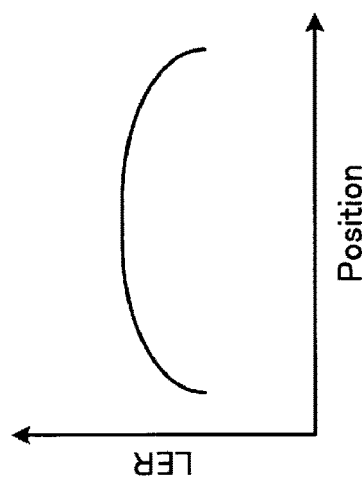
FIGS. 6A to 6C are views illustrating an example of a local change in device performance.
Figure 6B:
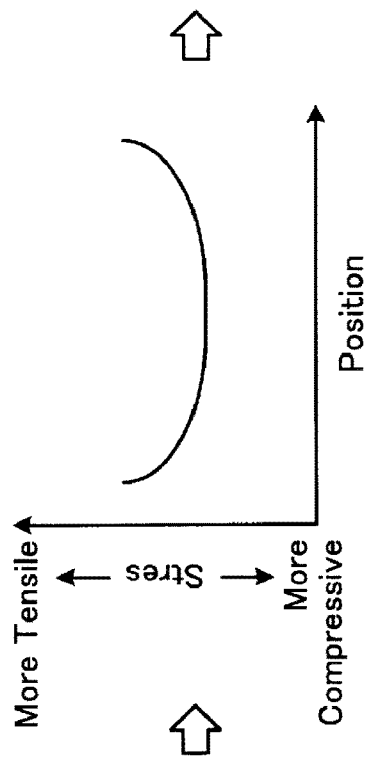
Figure 6A:
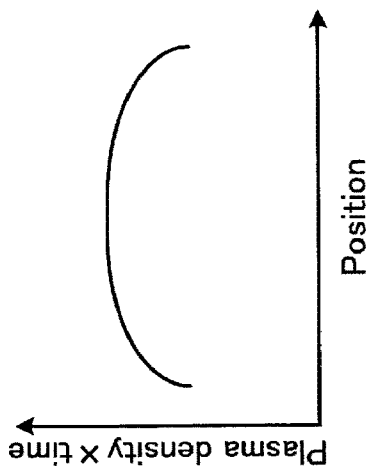

In the film formation of the titanium oxide film using the plasma ALD, the film stress changes depending on a product of the plasma density and the plasma irradiation time. Therefore, when the titanium oxide film is formed on the substrate W in the state in which the plasma density distribution is non-uniform, the plasma density distribution is transferred to a stress distribution. Thus, the stress distribution of the titanium oxide film on the substrate W becomes non-uniform, and the performance of a device manufactured on the substrate W locally changes. FIGS. 6A to 6C are views illustrating an example of a local change in device performance. In each of the graphs in FIGS. 6A to 6C, the horizontal axis represents a radial position in the plane of the substrate W, wherein the center of the horizontal axis corresponds to the central portion of the substrate W, and the left and right end portions of the horizontal axis correspond to the peripheral portion of the substrate W. When the plasma irradiation time is constant and the plasma density distribution is high in the central portion of the substrate W and low in the peripheral portion, the product of the plasma density and the plasma irradiation time through the plasma ALD is high in the central portion and low in the peripheral portion, as illustrated in FIG. 6A. When the titanium oxide film is formed on the substrate W through the plasma ALD, in terms of the film stress of the titanium oxide film, the central portion, rather than the peripheral portion, becomes the side of the compressive stress, as illustrated in FIG. 6B. In this case, the LER of the device on the substrate W is different between the peripheral portion and the central portion of the substrate W, as illustrated in FIG. 6C.

Therefore, during film formation, the controller 7 controls the capacitances of the variable capacitors 53a and 53b to adjust the magnitude of the radio frequency power to be supplied from the radio frequency power supply 52 to the shower plate 32 and the magnitude of the radio frequency power to be supplied from the radio frequency power supply 52 to the peripheral electrodes 39 and control the distribution of the film stress of a film to be formed For example, the controller 7 adjusts the magnitude of the radio frequency power to be supplied to the shower plate 32 and the magnitude of the radio frequency power to be supplied to the peripheral electrode 39 by adjusting a ratio of the magnitude of the radio frequency power to be supplied to the shower plate 32 to the magnitude of the radio frequency power to be supplied to the peripheral electrode 39 such that the plasma density distribution becomes uniform.

Figure 7A:
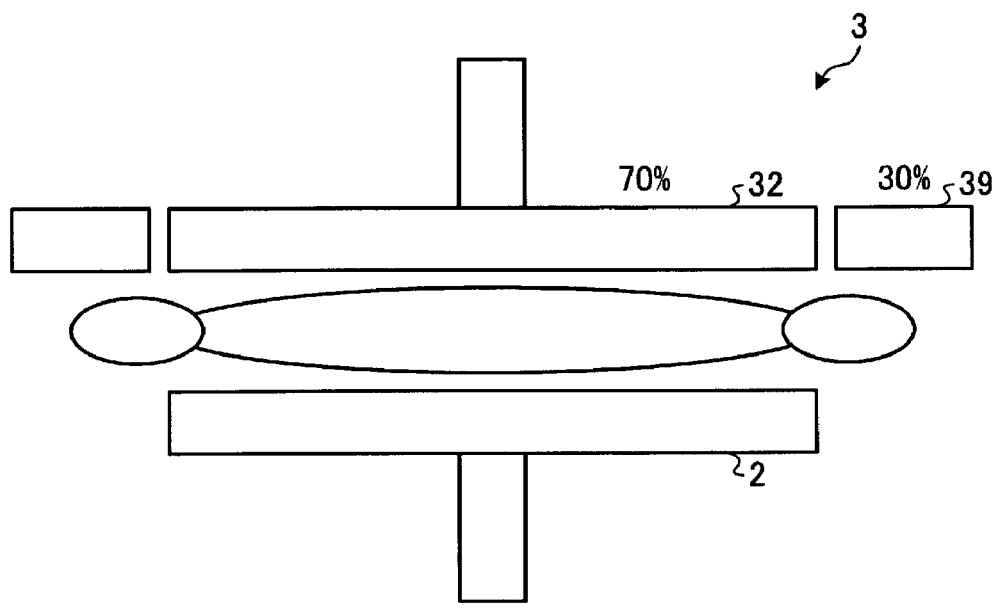
FIG. 7A is a view illustrating an example of adjustment of a magnitude of the radio frequency power.
Figure 7B:
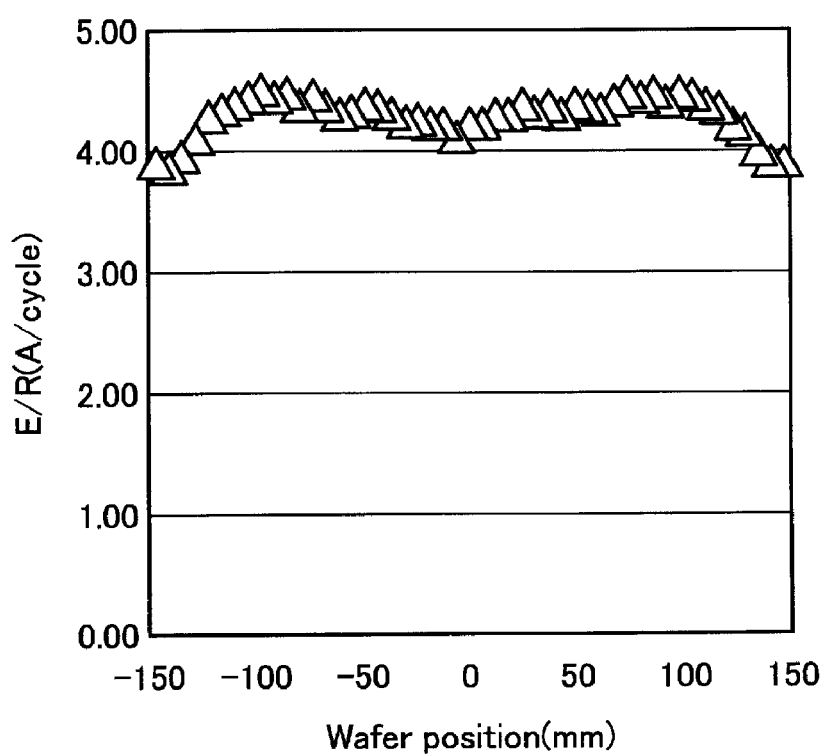
FIG. 7B is a view illustrating an example of adjustment of a magnitude of the radio frequency power.

Each of FIGS. 7A to 9B is a view illustrating an example of the adjustment of the magnitude of the radio frequency power. In FIG. 7A, 70% of the radio frequency power supplied from the radio frequency power supply 52 is supplied to the shower plate 32, and 30% of the radio frequency power is supplied to the peripheral electrode 39. In this case, the plasma density distribution is high in the central portion of the substrate W and low in the peripheral portion. FIG. 7B illustrates the plasma density distribution in terms of an etching rate (E/R) obtained by etching spin-on carbon (SOC) formed on the substrate W. The etching rate of the spin-on carbon increases as the plasma density distribution increases. Therefore, the higher the etching rate, the higher the plasma density distribution. In FIG. 7B, since the etching rate is high in the central portion of the substrate W and low in the peripheral portion, the plasma density distribution is high in the central portion of the substrate W and low in the peripheral portion.

Figure 8A:
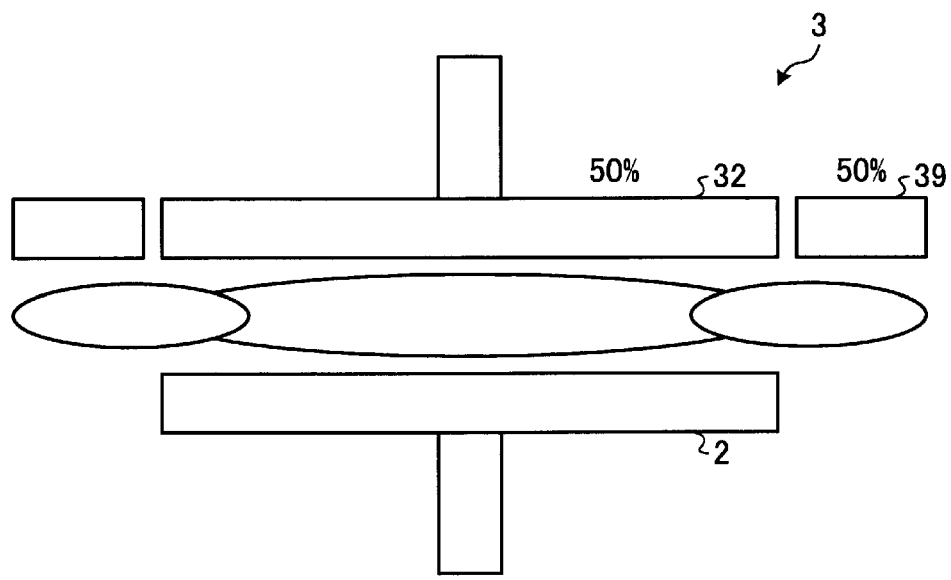
FIG. 8A is a view illustrating an example of adjustment of a magnitude of the radio frequency power.
Figure 8B:
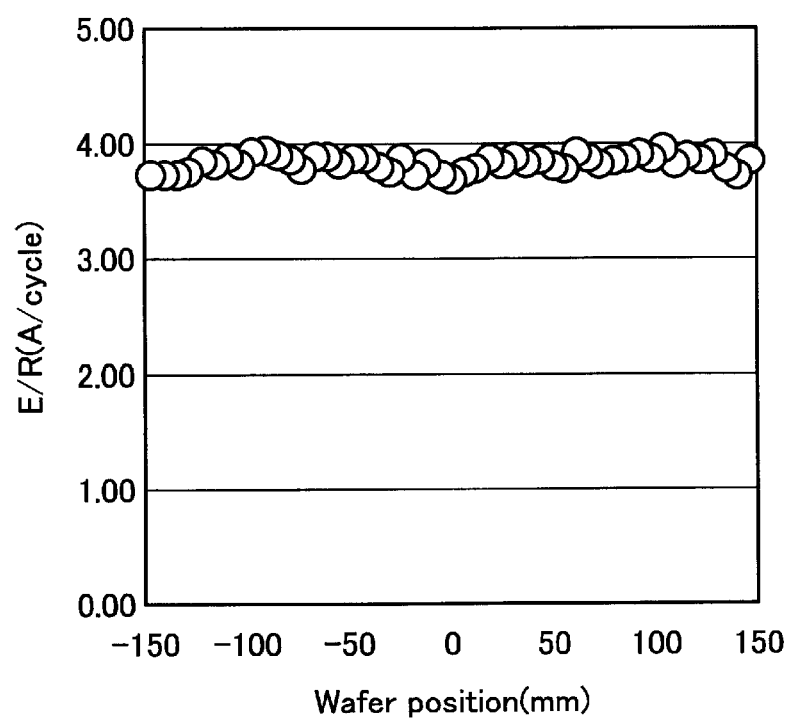
FIG. 8B is a view illustrating an example of adjustment of a magnitude of the radio frequency power.

In FIG. 8A, 50% of the radio frequency power supplied from the radio frequency power supply 52 is supplied to the shower plate 32, and 50% of the radio frequency power is supplied to the peripheral electrode 39. In this case, the plasma density distribution is the same in the central portion and the peripheral portion of the substrate W. FIG. 8B illustrates the plasma density distribution in terms of an etching rate obtained by etching the spin-on carbon (SOC) formed on the substrate W. In FIG. 8B, since the etching rate is the same in the central portion and the peripheral portion of the substrate W, the plasma density distribution is the same in the central portion and the peripheral portion of the substrate W.

Figure 9A:
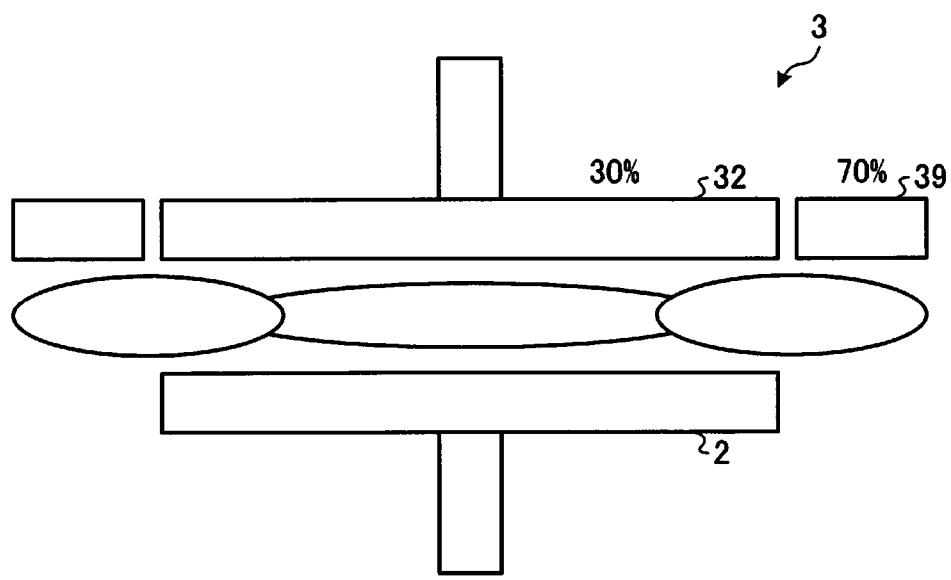
FIG. 9A is a view illustrating an example of adjustment of a magnitude of the radio frequency power.
Figure 9B:
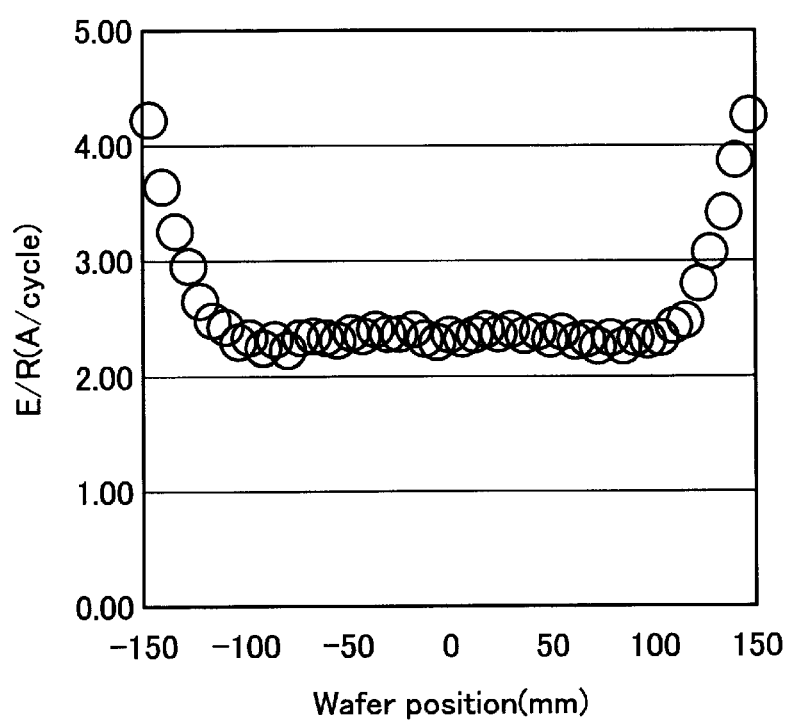
FIG. 9B is a view illustrating an example of adjustment of a magnitude of the radio frequency power.

In FIG. 9A, 30% of the radio frequency power supplied from the radio frequency power supply 52 is supplied to the shower plate 32, and 70% of the radio frequency power is supplied to the peripheral electrode 39. In this case, the plasma density distribution is low in the central portion of the substrate W and high in the peripheral portion. FIG. 9B illustrates the plasma density distribution in terms of an etching rate obtained by etching the spin-on carbon (SOC) formed on the substrate W. In FIG. 9B, since the etching rate is low in the central portion of the substrate W and high in the peripheral portion, the plasma density distribution is low in the central portion of the substrate W and high in the peripheral portion.

Using the variable capacitors 53a and 53b, the controller 7 performs one or both of an adjustment of reducing the magnitude of the radio frequency power corresponding to the portion in which the film stress is relatively compressive stress, and an adjustment of increasing the magnitude of the radio frequency power corresponding to the portion in which the film stress is relatively tensile stress. For example, using the variable capacitors 53a and 53b, the controller 7 performs the adjustment of reducing the magnitude of the radio frequency power corresponding to the portion in which the film stress is relatively compressive stress. In addition, using the variable capacitors 53a and 53b, the controller 7 performs a control of shortening a plasma generation time together with the adjustment of increasing the magnitude of the radio frequency power corresponding to the portion in which the film stress is relatively tensile stress.

FIGS. 10A to 10C are views illustrating an example of changes in film stress and LER in terms of the adjustment of magnitude of the radio frequency power. In each of the graphs in FIGS. 10A to 10C, the horizontal axis represents a radial position in the plane of the substrate W, wherein the center of the horizontal axis corresponds to the central portion of the substrate W, and the left and right end portions of the horizontal axis correspond to the peripheral portion of the substrate W. Each of FIGS. 10A to 10C illustrates a plasma density distribution on the substrate W and a film stress distribution of a titanium oxide film formed on the substrate W, and an LER of the titanium oxide film formed on the substrate W. For example, when the plasma irradiation time is constant and the plasma density distribution is high in the central portion of the substrate W and low in the peripheral portion, the product of the plasma density and the plasma irradiation time through the plasma ALD is high in the central portion and low in the peripheral portion, as illustrated in FIG. 10A. In this case, the film stress distribution is compressive in the central portion, rather than in the peripheral portion. In addition, the LER of a device on the substrate W is different between the peripheral portion and the central portion of the substrate W.

For example, using the variable capacitors 53a and 53b, the controller 7 performs the adjustment of increasing the magnitude of the radio frequency power in the peripheral portion of the substrate W in which the film stress is relatively tensile stress. By increasing the magnitude of the radio frequency power in the peripheral portion of the substrate W, the plasma density distribution in the peripheral portion of the substrate W is increased and the plasma density distribution becomes uniform. As a result, the product of the plasma density and the plasma irradiation time through the plasma ALD rises in the peripheral portion of the substrate W and becomes equal in the central portion and the peripheral portion, as illustrated in FIG. 10B. In this case, the film stress distribution increases in the peripheral portion of the substrate W and becomes the same in the peripheral portion and the central portion. In addition, the LER of a device on the substrate W also rises in the peripheral portion of the substrate W and becomes equal in the peripheral portion and the central portion of the substrate W.

However, due to the increase in the plasma density in the peripheral portion of the substrate W, the film stress and the LER are increased on average.

Therefore, the controller 7 performs the control of shortening the plasma generation time. For example, the controller 7 shortens the time for supplying the radio frequency power from the radio frequency power supply 52. Thus, the product of the plasma irradiation time is reduced as a whole. As a result, the product of the plasma density and the plasma irradiation time through the plasma ALD decreases as a whole, as illustrated in FIG. 10C. In this case, the film stress distribution shifts to the side of the tensile stress as a whole. The LER of a device on the substrate W is lowered as a whole.

The controller 7 may perform an adjustment of reducing the magnitude of the radio frequency power corresponding to the portion in which the film stress is relatively compressive stress. In this case, the film stress changes to the tensile stress on average, and the LER decreases on average. Therefore, the controller 7 may not perform the control of shortening the plasma generation time.

In the film formation of the titanium oxide film using the plasma ALD, the film formation rate may change with respect to the ion energy of plasma and the plasma irradiation time depending on a gas used.

Figure 11A:
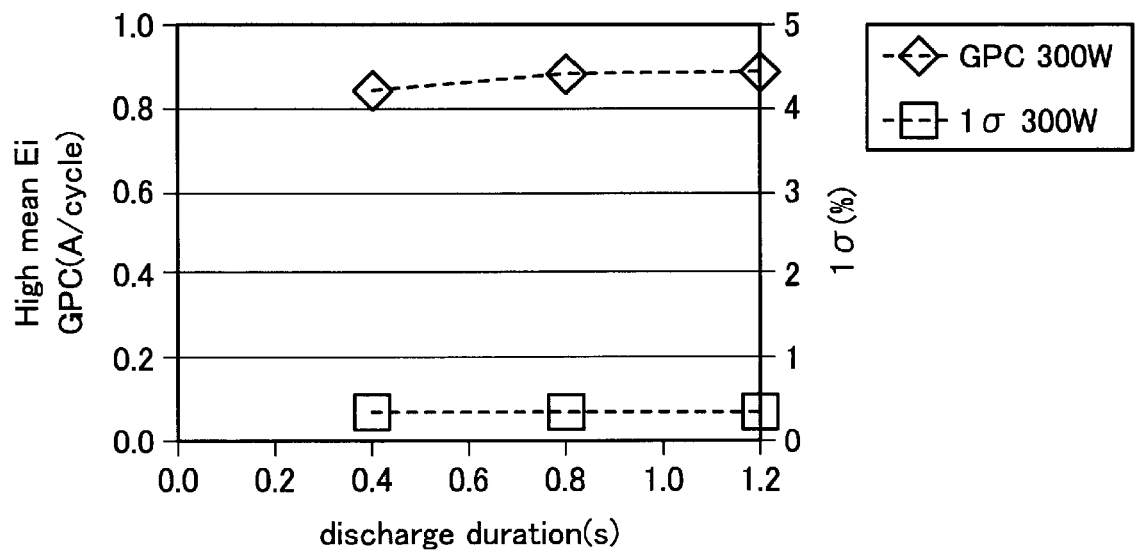
FIG. 11A is a view illustrating an example of a film forming rate when a titanium oxide film is formed using a $TiCl_4$ gas as a titanium-containing gas.
Figure 11B:
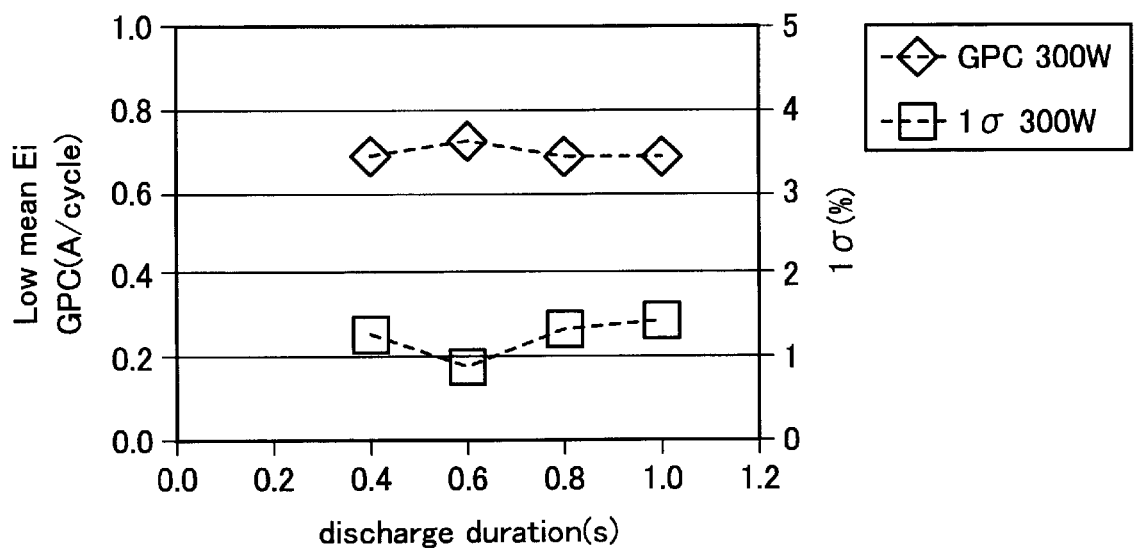
FIG. 11B is a view illustrating an example of a film forming rate when a titanium oxide film is formed using a $TiCl_4$ gas as a titanium-containing gas.

FIGS. 11A and 11B are views illustrating an example of a film forming rate when a titanium oxide film is formed using a $TiCl_4$ gas as a titanium-containing gas. In FIGS. 11A and 11B, the $TiCl_4$ gas is supplied for 0.05 seconds in step S1 illustrated in FIG. 3, and for 1.2 seconds in step S2. In step S3, a plasma irradiation time for performing plasma irradiation by supplying the radio frequency power while supplying the $O_2$ gas is changed, and is set to 0.1 seconds in step S4. The horizontal axis of each of FIGS. 11A and 11B represent a plasma irradiation time. In addition, in FIGS. 11A and 11B, the magnitude of the radio frequency power is set to 300 W, but the frequency of the radio frequency power is changed so as to change the ion energy of the plasma. In FIG. 11A, the frequency of the radio frequency power is set to, for example, 450 KHz, and the ion energy of the plasma is set at a high level. In FIG. 11B, the frequency of the radio frequency power is set to, for example, 13 MHz, and the ion energy of the plasma is set at a low level. In FIGS. 11A and 11B, the film formation rate (GPC) of the titanium oxide film on the substrate W according to a change in plasma irradiation time and a film thickness distribution of the titanium oxide film on the substrate W are represented by values of 1σ.

Figure 12A:
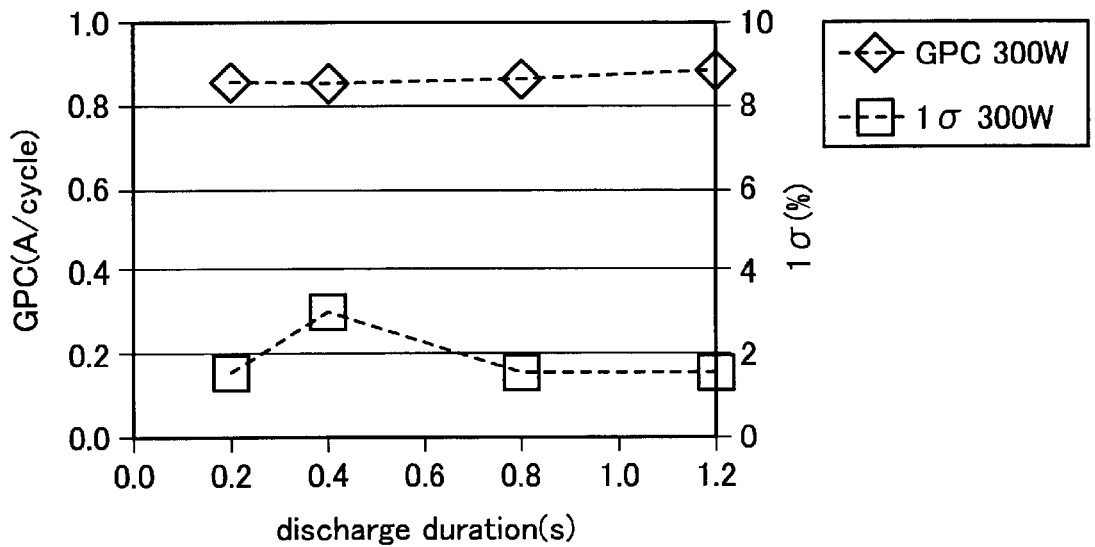
FIG. 12A is a view illustrating an example of a film forming rate when a titanium oxide film is formed using a TDMAT gas as a titanium-containing gas.
Figure 12B:
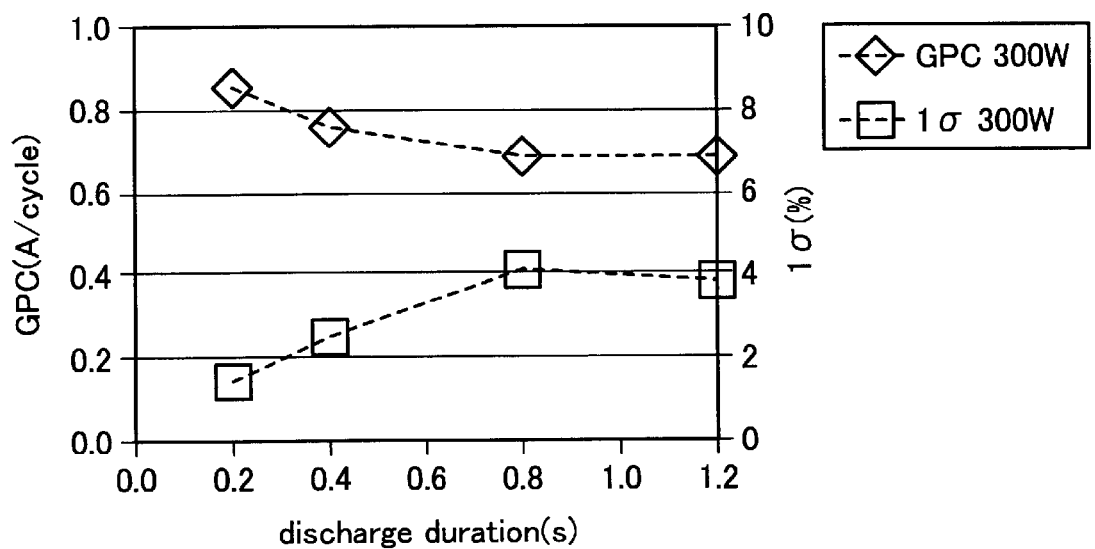
FIG. 12B is a view illustrating an example of a film forming rate when a titanium oxide film is formed using a TDMAT gas as a titanium-containing gas.

FIGS. 12A and 12B are views illustrating examples of film formation rates when a titanium oxide film is formed using a TDMAT gas as a titanium-containing gas. In FIGS. 12A and 12B, the TDMAT gas is supplied for 0.4 seconds in step S1 illustrated in FIG. 3, and for 1.2 seconds in step S2. In step S3, a plasma irradiation time for performing plasma irradiation by supplying the radio frequency power while supplying the $O_2$ gas is changed, and is set to 0.1 seconds in step S4. In each of FIGS. 12A and 12B, the horizontal axis represents the plasma irradiation time. In FIGS. 12A and 12B, the magnitude of the radio frequency power is set to 300 W, but impedance of the lower portion of the processing container 1 is adjusted by an impedance control mechanism 56 so as to change the ion energy of plasma. In FIG. 12A, the ion energy of the plasma is at a high level. In FIG. 12B, the ion energy of the plasma is at a low level. In FIGS. 12A and 12B, the film formation rate (GPC) of the titanium oxide film on the substrate W according to a change in plasma irradiation time and the film thickness distribution of the titanium oxide film on the substrate W are represented by values of 1σ. The ion energy may also be changed by changing the frequency, rather than the impedance control mechanism 56. In this case, the higher the frequency, the lower the ion energy.

As illustrated in FIGS. 11A and 11B, in the case of the $TiCl_4$ gas, the change in film formation rate and film thickness distribution is small even when the plasma irradiation time is changed. Thus, it is possible to form a film with good uniformity. Meanwhile, in the case of the TDMAT gas, when the plasma irradiation time is changed, the film formation rate and the film thickness distribution change, and thus the film thickness may change. Therefore, when using the $TiCl_4$ gas as the titanium-containing gas, the film forming apparatus 100 is capable of suppressing the change in film thickness at a low level so as to change the film stress even when the plasma irradiation time is changed.

As described above, the film forming apparatus 100 according to the present embodiment includes the processing container 1, the shower plate 32, the peripheral electrode 39, the radio frequency power supply 52, the variable capacitors 53a and 53b, the gas supplier 5, and the controller 7. The processing container 1 is provided therein with the susceptor 2 on which the substrate W as an object on which a film is to be formed is placed. The shower plate 32 is disposed inside the processing container 1 so as to face the susceptor 2. The peripheral electrode 39 faces the susceptor 2, and is disposed around the shower plate 32. The radio frequency power supply 52 supplies the radio frequency power to the shower plate 32 and the peripheral electrode 39. The variable capacitors 53a and 53b adjust the magnitude of the radio frequency power to be supplied from the radio frequency power supply 52 to the shower plate 32 and the magnitude of the radio frequency power to be supplied from the radio frequency power supply 52 to the peripheral electrode 39, respectively. The gas supplier 5 supplies the titanium-containing gas and the oxidizing gas that oxidizes titanium into the processing container 1. The film forming apparatus 100 alternately supplies the titanium-containing gas and the oxidizing gas from the gas supplier 5, and supplies the radio frequency power from the radio frequency power supply 52 to the shower plate 32 and the peripheral electrode 39, parallel to the supply of the oxidizing gas, so as to generate plasma and to perform film formation. While plasma is being generated and film formation is being performed, the controller 7 controls the magnitudes of the radio frequency powers to be supplied to the shower plate 32 and the peripheral electrodes 39 using the variable capacitors 53a and 53b. This makes it possible for the film forming apparatus 100 to control the film stress of a film to be formed.

In addition, the controller 7 controls the magnitudes of the radio frequency powers to be supplied to the shower plate 32 and the peripheral electrode 39 using the variable capacitors 53a and 53b such that a plasma density distribution becomes uniform. Thus, the film forming apparatus 100 can make a film stress distribution in a film to be formed uniform. As a result, the film forming apparatus 100 is capable of suppressing a change in performance of an electronic device in the plane of the substrate W.

In addition, using the variable capacitors 53a and 53b, the controller 7 performs one or both of the control of reducing the magnitude of the radio frequency power corresponding to the portion in which the film stress is high and the control of increasing the magnitude of the radio frequency power corresponding to the portion in which the film stress is low. Thus, the film forming apparatus 100 can make a film stress distribution in a film to be formed uniform.

In addition, using the variable capacitors 53a and 53b, the controller 7 performs the control of reducing the magnitude of the radio frequency power corresponding to the portion in which the film stress is high. Moreover, using the variable capacitors 53a and 53b, the controller 7 performs the control of increasing the magnitude of the radio frequency power corresponding to the portion in which the film stress is low and shortening the plasma generation time. This makes it possible for the film forming apparatus 100 to reduce the film stress of a film to be formed as a whole.

Furthermore, the gas supplier 5 alternately supplies the $TiCl_4$ gas and the $O_2$ gas into the processing container 1 so as to form the titanium oxide film. As a result, the film forming apparatus 100 is capable of suppressing changes in the film formation rate and the film thickness distribution at a low level even when the plasma irradiation time is changed in order to control the film stress.

In addition, the susceptor 2 has the heater 21 built therein and heats the substrate W to a temperature of 200 degrees C. or lower. When the $TiO_2$ film is formed at a temperature higher than 200 degrees C., the film crystallizes and the strength thereof changes. Therefore, when forming the $TiO_2$ film, it is preferable set the temperature of the substrate W to 200 degrees C. or lower.

Although the embodiments has been described above, it should be noted that the embodiments disclosed herein are exemplary in all respects and are not restrictive. Indeed, the above-described embodiment can be implemented in various forms. The above-described embodiments may be omitted, replaced or modified in various forms without departing from the scope and spirit of the appended claims.

For example, in the embodiments, although the case in which the substrate W is a semiconductor wafer has been described as an example, the present disclosure is not limited thereto. The substrate W may be silicon or a compound semiconductor of, for example, GaAs, SiC, or GaN. In addition, the substrate W may be a glass substrate used for a flat panel display (FPD) such as a liquid crystal display device, a ceramic substrate, or the like.

In the embodiments, the case in which the film forming apparatus 100 forms the oxide film on the substrate W has been described as an example, but the present disclosure is not limited thereto. The film forming apparatus 100 may alternately supply a silicon-containing gas and a nitriding gas that nitrides silicon, and supply the radio frequency power from the radio frequency power supply 52 to the shower plate 32 and the peripheral electrode 39, parallel to the supply of the nitriding gas, so as to generate plasma and form a nitride film on the substrate W. While the plasma is being generated and the nitride film is being performed, the controller 7 may control the magnitudes of the radio frequency powers to be supplied to the shower plate 32 and the peripheral electrode 39 using the variable capacitors 53a and 53b. Examples of the silicon-containing gas may include dichlorosilane (DCS), and the like. Examples of the nitriding gas may include a $NH_3$ gas, a $N_2$ gas and the like. When forming the nitride film, the film forming apparatus 100 heats the substrate W by controlling the temperature of the susceptor 2 to a predetermined temperature (e.g., 600 degrees C.) using the heater 21. The temperature of the substrate W may be 600 degrees C. or lower.

Furthermore, in the embodiments, the case in which a single peripheral electrode 39 is provided around the shower plate 32 has been described as an example, but the present disclosure is not limited thereto. For example, a plurality of peripheral electrodes 39 having different diameters may be provided around the shower plate 32. Further, a plurality of peripheral electrodes 39 may be provided as being circumferentially divided.

Figure 13:
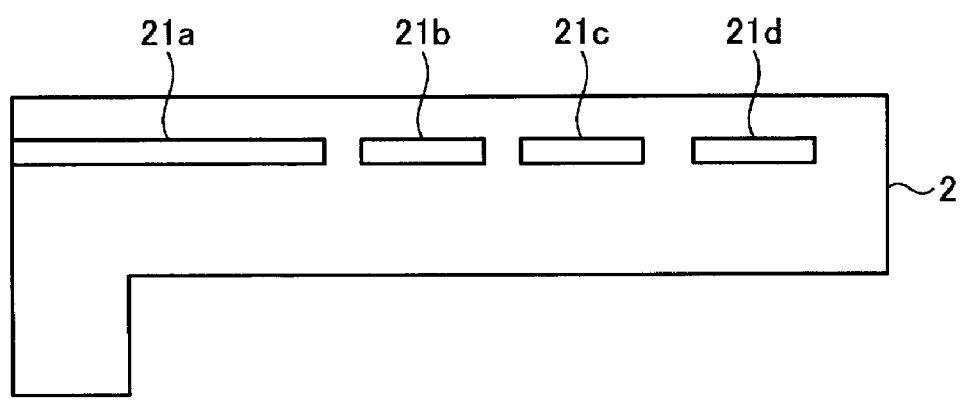
FIG. 13 is a illustrating an example in which a plurality of heaters are provided in a susceptor.

Furthermore, in the embodiments, the case in which the film forming apparatus 100 forms the oxide film on the substrate W such that a film thickness distribution is uniform has been described as an example, but the present disclosure is not limited thereto. For example, the substrate W on which an oxide film or a nitride film is formed by the film forming apparatus 100 is transferred to an etching apparatus where the substrate W is subjected to etching. It is assumed that an etching rate distribution in the etching apparatus is non-uniform between the central portion and the peripheral portion of the substrate W. In such a case, in accordance with the distribution of the etching rate, the film forming apparatus 100 may form a thick film on a portion having a high etching rate and a thin film on a portion having a low etching rate. For example, a film formation rate of a titanium oxide decreases as the temperature of the substrate W increases. Therefore, the film forming apparatus 100 may control the film thickness distribution of an oxide film or a nitride film to be formed on the substrate W by providing the heater 21 in each of the central portion and the peripheral portion of the susceptor 2, and controlling the temperature of the substrate W so as to control the film formation rates in the central portion and the peripheral portion of the substrate W. FIG. 13 is a view illustrating an example in which a plurality of heaters are provided in the susceptor 2. The susceptor 2 is provided with a heater 21a in the central portion. In addition, the susceptor 2 is provided with disk-shaped heaters 21b to 21d so as to surround the heater 21a. The heaters 21a to 21d heat a central circular zone in the surface of the susceptor 2 and three annular zones surrounding the circular zone, respectively. For example, in the case of forming a titanium oxide film such that the thickness of the film is thick in the central portion of the substrate W and thin in the peripheral portion of the substrate W, the controller 7 may control the temperature of the heater 21 at a high level toward the peripheral portion. For example, in the case of forming a titanium oxide film such that the thickness of the film is thin in the central portion of the substrate W and thick in the peripheral portion of the substrate W, the controller 7 may control the temperature of the heater 21 at a high level toward the central portion. This makes it possible for the film forming apparatus 100 to change the film thickness distribution while suppressing a change in film stress at a low level.

Furthermore, in the embodiments, the case in which a titanium oxide film is used for forming an upper hard mask at the time of double patterning has been described as an example, but the present disclosure is not limited thereto. For example, it is possible to use a titanium oxide film when forming a hard mask having a predetermined pattern on Si. In addition, the titanium film is applicable not only to the formation of a hard mask, but also to all applications in which a TiO$_2$ film needs to be formed on Si.

EXPLANATION OF REFERENCE NUMERALS

1: processing container, 2: susceptor, 3: gas supplier, 7: controller, 32: shower plate, 39: peripheral electrode, 52: radio frequency power supply, 53a, 53b: variable capacitor, 100: film forming apparatus, W: substrate

What is claimed is:

1. A film forming apparatus comprising:
    a processing container including a stage on which a substrate as an object on which a film is to be formed is placed;
    a first electrode disposed inside the processing container to face the stage;
    a second electrode disposed around the first electrode while facing the stage;
    one power supply configured to supply radio frequency power to each of the first electrode and the second electrode;
    an adjuster configured to adjust a magnitude of the radio frequency power to be supplied from the one power supply to each of the first electrode and the second electrode, and comprising a first adjuster configured to adjust a magnitude of the radio frequency power supplied to the first electrode and a second adjuster configured to adjust a magnitude of the radio frequency power supplied to the second electrode;
    a gas supplier configured to supply a titanium-containing gas and an oxidizing gas that oxidizes titanium, or a silicon-containing gas and a nitriding gas that nitrides silicon, into the processing container; and
    a controller configured to control the magnitude of the radio frequency power to be supplied to each of the first electrode and the second electrode using the adjuster such that a plasma density distribution of the substrate becomes uniform when the titanium-containing gas and the oxidizing gas or the silicon-containing gas and the nitriding gas are alternately supplied from the gas supplier and the radio frequency power is supplied to each of the first electrode and the second electrode from the one power supply, parallel to the supply of the oxidizing gas or the nitriding gas, so as to generate plasma and to perform a film formation,
    wherein the controller is configured to control the first adjuster and the second adjuster to perform one or both of a control of reducing the magnitude of the radio frequency power corresponding to a portion of the substrate in which a film stress is high and a control of increasing the magnitude of the radio frequency power corresponding to a portion of the substrate in which the film stress is low.

2. The film forming apparatus of claim 1, wherein the controller is configured to perform, using the first adjuster and the second adjuster, the control of reducing the magnitude of the radio frequency power corresponding to the portion of the substrate in which the film stress is high, or configured to perform, using the first adjuster and the second adjuster, the control of increasing the magnitude of the radio frequency power corresponding to the portion of the substrate in which the film stress is low and a control of shortening a plasma generation time.

3. The film forming apparatus of claim 2, wherein the gas supplier is configured to alternately supply a TiCl$_4$ gas and an O$_2$ gas into the processing container so as to form a titanium oxide film on the substrate.

4. The film forming apparatus of claim 3, wherein the gas supplier is configured to supply the titanium-containing gas and the oxidizing gas into the processing container, and the stage includes a heater embedded therein so as to heat the substrate to a temperature of 200 degrees C. or lower.

5. The film forming apparatus of claim 1, wherein the gas supplier is configured to alternately supply a TiCl$_4$ gas and an $O_2$ gas into the processing container so as to form a titanium oxide film on the substrate.

6. The film forming apparatus of claim 5, wherein the gas supplier is configured to supply the titanium-containing gas and the oxidizing gas into the processing container, and the stage includes a heater embedded therein so as to heat the substrate to a temperature of 200 degrees C. or lower.

7. A method of forming a film, the method comprising:
supplying a titanium-containing gas and an oxidizing gas that oxidizes titanium, or a silicon-containing gas and a nitriding gas that nitrides silicon, into a processing container including a stage, wherein a substrate as an object on which the film is to be formed is placed on the stage, and
when radio frequency power is supplied from one power supply to a first electrode disposed inside the processing container to face the stage and a second electrode disposed around the first electrode, parallel to the supply of the oxidizing gas or the nitriding gas, so as to generate plasma and to perform a film formation, adjusting a magnitude of the radio frequency power to be supplied to the first electrode by a first adjuster and a magnitude of the radio frequency power to be supplied to the second electrode by a second adjuster such that a plasma density distribution of the substrate becomes uniform by controlling the first adjuster and the second adjuster to perform one or both of a control of reducing the magnitude of the radio frequency power corresponding to a portion of the substrate in which a film stress is high and a control of increasing the magnitude of the radio frequency power corresponding to a portion of the substrate in which the film stress is low.

* * * * *